(12) United States Patent
Taubman

(10) Patent No.: US 8,963,628 B2
(45) Date of Patent: Feb. 24, 2015

(54) TRANSISTOR-BASED FILTER FOR INHIBITING LOAD NOISE FROM ENTERING A POWER SUPPLY

(71) Applicant: Matthew S. Taubman, West Richland, WA (US)

(72) Inventor: Matthew S. Taubman, West Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 7 days.

(21) Appl. No.: 13/909,571

(22) Filed: Jun. 4, 2013

(65) Prior Publication Data

US 2013/0265105 A1 Oct. 10, 2013

Related U.S. Application Data

(63) Continuation of application No. 13/397,928, filed on Feb. 16, 2012, now Pat. No. 8,476,969.

(51) Int. Cl.
*H03B 1/00* (2006.01)
*H03H 11/04* (2006.01)
*H03H 11/12* (2006.01)
*H02M 1/44* (2007.01)

(52) U.S. Cl.
CPC ........... *H03H 11/04* (2013.01); *H03H 11/1213* (2013.01); *H02M 1/44* (2013.01)

USPC .......................................................... 327/552

(58) Field of Classification Search
USPC ................................................. 327/551–559
See application file for complete search history.

(56) References Cited

U.S. PATENT DOCUMENTS

2008/0061713 A1\* 3/2008 Zeng .............................. 315/291

OTHER PUBLICATIONS

Bradley, C. C., et al., Instrumentation for the stable operation of alser diodes, Rev. Sci. Instrum. 61, 8, Aug. 1990.
Ray, A., et al., A Current Controller for Tunable Near Infrared Diode Laser, IETE Technical Review, vol. 17, Part 1/2, 2000, pp. 61-66, Institute of Electronics & Telecommunication.
Ray, A., et al., A simple scanning semiconductor diode laser source and its application in wavelength modulation spectroscopy around 825 nm, Optics & Laser Technology, 39, 2007, pp. 359-367.

\* cited by examiner

*Primary Examiner* — Sibin Chen
(74) *Attorney, Agent, or Firm* — A. J. Gokcek

(57) ABSTRACT

A transistor-based filter for inhibiting load noise from entering a power supply is disclosed. The filter includes a first transistor having an emitter coupled to a power supply, a collector coupled to a load, and a base. The filter also includes a first capacitor coupled between the base of the first transistor and a ground terminal The filter further includes an impedance coupled between the base and a node between the collector and the load, or a second transistor and second capacitor. The impedance can be a resistor or an inductor.

9 Claims, 8 Drawing Sheets

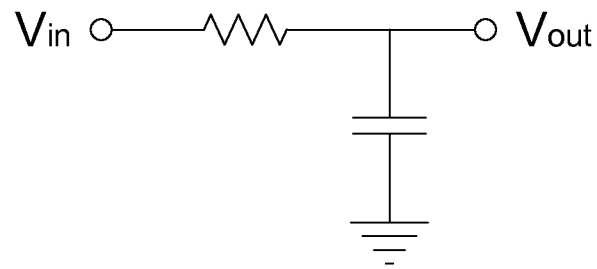
FIGURE 1A - PRIOR ART
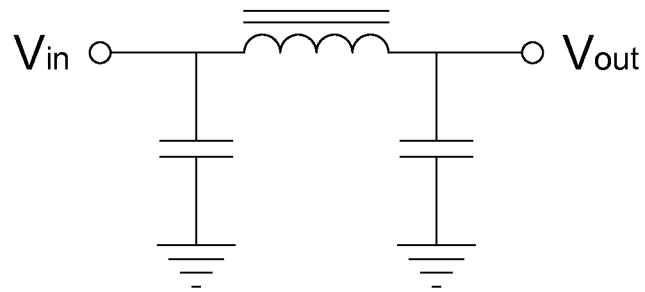
FIGURE 1B - PRIOR ART
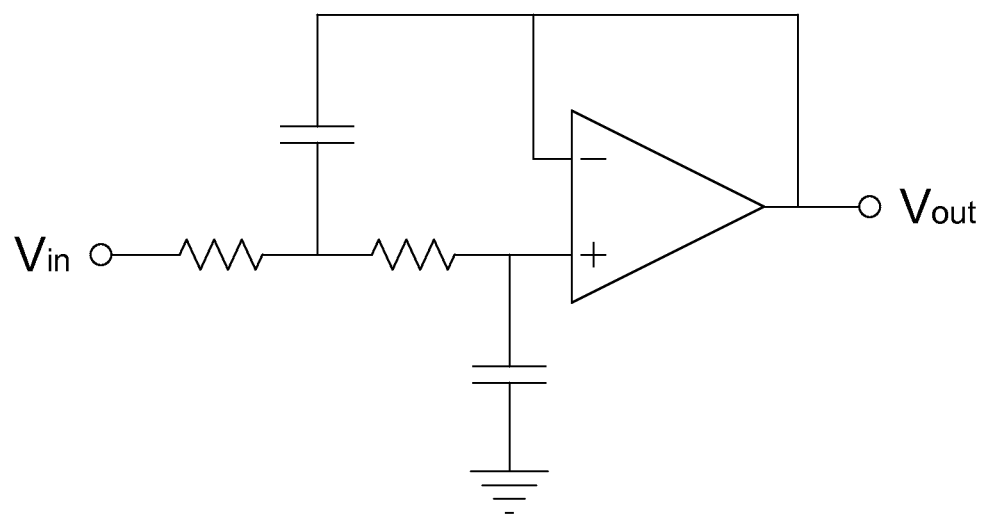
FIGURE 2 - PRIOR ART

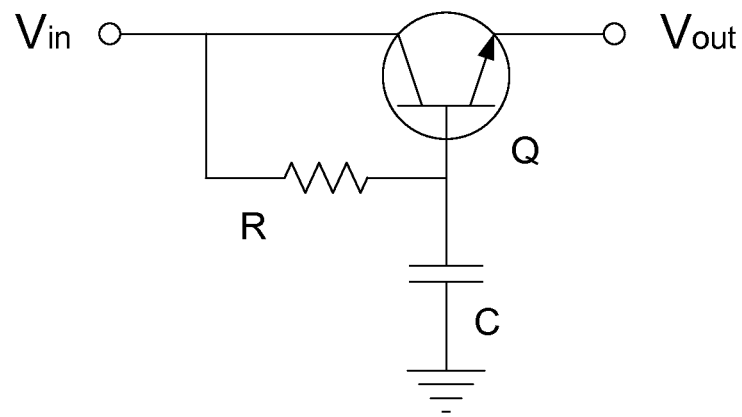
FIGURE 3 - PRIOR ART
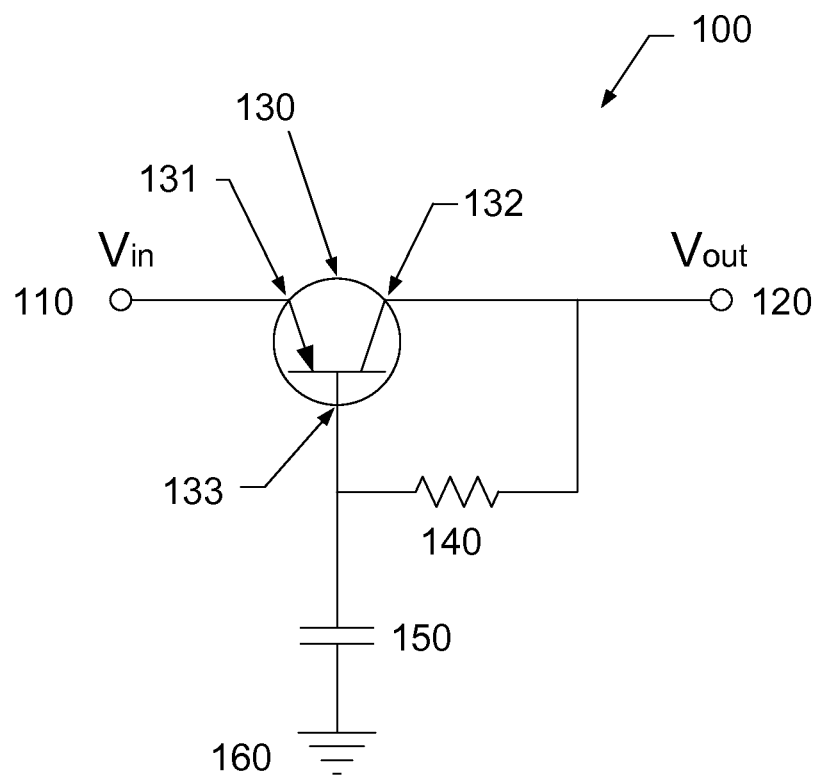
FIGURE 4

TRANSISTOR-BASED FILTER FOR INHIBITING LOAD NOISE FROM ENTERING A POWER SUPPLY

CROSS REFERENCE TO RELATED APPLICATION

This application claims priority from and is a continuation of U.S. patent application Ser. No. 13/397,928 filed by the same inventor on Feb. 16, 2012 and entitled "Transistor Based Filter For Inhibiting Load Noise From Entering A Power Supply," the contents of which are hereby incorporated by reference

STATEMENT REGARDING FEDERALLY SPONSORED RESEARCH OR DEVELOPMENT

The invention was made with Government support under Contract DE-AC05-76RLO1830, awarded by the U.S. Department of Energy. The Government has certain rights in the invention.

TECHNICAL FIELD

This invention relates to filters. More specifically, this invention relates to a transistor-based filter that inhibits load noise from entering a power supply.

BACKGROUND OF THE INVENTION

Filtering electrical power can be an important aspect of power distribution systems at many levels, from commercial AC power distribution down to the DC power rails within an instrument that performs sensitive tasks. There are many sources of electrical noise found in modern electronics, including line noise, RF noise from high frequency circuits, and digital noise from computer subsystems. Problems arise when noise-sensitive components must run on power systems already polluted by noisy sub-systems. While inductor-capacitor filters are effective both for sheltering sensitive components and isolating noisy ones in many applications, they are not practical for high levels of broadband low frequency noise, such as is typical of modern DC electric cooling fans.

Filters can take a variety of forms, some of the simplest being the RC and LC filters shown in FIGS. 1A and 1B respectively. Passive filters are extremely common, and are used in both signal and power circuitry. For example, the low-pass filters shown in the FIG. 1A and FIG. 1B could be used to attenuate AC components present on a DC power rail, or to separate low and high frequency AC signals. In many cases, the action of passive networks is reversible, meaning that they have a similar filter behavior if turned end-for-end. Consequently, such networks, if used to remove noise, can do so in both directions, thus protecting the load from the source, and the source from the load.

Well-designed LC filters are superb both as signal extraction or noise rejection circuits for frequencies from the tens of kilohertz into the megahertz. However, below a kilohertz, components for LC filters and capacitors for RC filters become progressively larger as frequency further decreases. The broadband performance of such low frequency filter components can also be sub-optimal, requiring multiple stages of filtering for different frequency ranges. Active filters such as that shown in FIG. 2 answer some of these problems for signal filter systems, allowing physically small circuits to have corner frequencies of a Hertz or less, while retaining correct behavior into the hundreds of kilohertz or low megahertz in many cases. However, active filters such as this do not pass power from the input to the output, so they are not power filtering devices.

In order to filter low frequency noise from DC power rails in an active manner, transistor-based filters are effective, although far less studied than operational amplifier-based circuits. A basic transistor filter is shown in FIG. 3. This circuit is also known as a capacitance multiplier. The transistor Q passes current to any load attached to $V_{out}$ via its emitter, a very low impedance connection. Since the base-emitter voltage ($V_{be}$) of a bipolar junction transistor (BJT) varies as the logarithm of the collector current, $V_{out}$ varies only slightly for significant changes in load current. (At a room temperature of 300 Kelvin, a 10-fold increase in collector current corresponds to an increase in $V_{be}$ of approximately 60 mV.) In contrast, current is delivered to this circuit via the collector of Q, a high impedance terminal Provided it remains above the saturation value of Q for a given current flow, the collector-base voltage ($V_{cb}$) of the transistor can vary over the full range specified for the device, with little impact on $V_{be}$. (There is a small coupling between the two through the Early effect, but this is negligible in this circuit.) The important consequence is that the voltage appearing at the emitter of Q, is primarily determined by the voltage at its base, which in this circuit equals the voltage appearing across capacitor C. This voltage is in turn a filtered version of input $V_{in}$, fluctuations in voltage above the corner frequency of the RC network being attenuated. Finally, because of the near constant $V_{be}$ value of Q, fluctuations in $V_{in}$ above the RC corner frequency are also attenuated at $V_{out}$.

Transistor Q acts as a voltage follower, or a current amplifier in this filter circuit. While the voltage characteristics appearing at $V_{out}$ are very similar to those at the base of Q, the current capability at these two nodes is very different. The current passing out the emitter of a typical BJT (when operating in its linear region) are typically hundreds of times that into its base. Because of this, the current capacity of R and C can be small (i.e., large R-value and small C-value), and thus their physical sizes can be small for a given RC time constant or filtering capability. Since the voltage drop across Q ($V_{ce}$) is in general around a volt for this circuit, Q does not dissipate large amounts of power, and can thus also be small despite a large current capacity. Consequently, these three components can make a very effective low-pass filter for low frequency noise, with much smaller components than the equivalent LC or RC power filter that passes the same current flow.

While the circuit of FIG. 3 protects the load from noise in a power supply, the reverse is not true. The power supply is not protected from noise developed in the load. Load-induced voltage changes are caused by rapid changes in current demand. Such current spikes or surges would propagate directly back through transistor Q into the power supply through $V_{in}$. This in turn would cause a voltage change across the power supply commensurate with its output impedance, in a similar manner as would occur if the filter were omitted from the circuit.

What is needed is a transistor-based filter that protects the power supply from noise developed in the load.

SUMMARY OF THE INVENTION

The present invention is directed to a transistor-based filter for inhibiting load noise from entering a power supply. In one embodiment, the filter includes a first transistor with an emitter coupled to a power supply, a collector coupled to a load, and a base. The filter also includes a first capacitor coupled between the base and a ground terminal and a first resistor coupled between the base and a node between the collector and the load. The first capacitor charges through the base of the first transistor, turning the first transistor on. The first resistor pulls a bias current from the base of the first transistor to keep it turned on after the first capacitor has charged.

During normal operation, the first transistor is insensitive to noise voltages developed across the load. Voltage noise generated in the load is inhibited from coupling upstream to the power supply through the first transistor.

In one embodiment, the transistor-based filter further comprises at least one diode coupled between the base, and the collector of the transistor, wherein an anode of the at least one diode is coupled to the base and a cathode of the at least one diode is coupled to the collector.

In another embodiment, the transistor-based filter further comprises at least one zener diode inserted between the base and the collector of the transistor, wherein a cathode of the at least one zener diode is coupled to the base, and an anode of the at least one zener diode is coupled to the collector. In another embodiment, the at least one zener diode is in series with at least one diode in either order, provided polarity with respect to the transistor is preserved.

In another embodiment, the transistor-based filter also comprises a second resistor inserted between the first resistor and the node between the collector and the load; and a second capacitor coupled from the node between the first and the second resistors to the ground terminal.

In another embodiment, the transistor-based filter also comprises a third capacitor coupled between the node common to the collector and the load, and the ground terminal.

In one embodiment, the transistor-based filter also comprises a first inductor coupled between the power supply and the emitter.

In another embodiment, the transistor-based filter also comprises a fourth capacitor coupled between a node common to the power supply and the first inductor, and the ground terminal.

In another embodiment, the transistor-based filter also comprises a third resistor inserted between the base of the first transistor and the first capacitor.

In another embodiment, the transistor-based filter also comprises at least one diode connected from the emitter of the first transistor to the first capacitor, wherein an anode of the at least one diode is connected to the emitter of the first transistor and a cathode of the at least one diode is connected to the non-grounded end of the first capacitor.

In another embodiment, the transistor-based filter also comprises a snubber network to reduce oscillations, if any, occurring at the node common to the first inductor and the first transistor. In one embodiment, the snubber network is coupled from the node between the first inductor and the first transistor to the ground terminal. In another embodiment, the snubber network is coupled from the node between the first inductor and the first transistor to the base of the first transistor. In another embodiment, the snubber network is coupled from the node between the first inductor and the first transistor to the power supply.

The load can be, but is not limited to, a fan or a pump. In one embodiment, the fan is a brushless DC fan.

The load can be a device drawing a periodically varying current, such as a current-modulated or current-swept laser. The laser can be a quantum cascade laser.

Preferably, the transistor-based filter of the present invention is used in a system in which multiple loads are connected to the same power supply, either directly or indirectly.

In one embodiment, the transistor-based filter includes a second transistor. A base of the second transistor is coupled to the emitter of the first transistor; a fourth resistor is inserted between the emitter of the first transistor and the first inductor; a collector of the second transistor is coupled to the collector of the first transistor; an emitter of the second transistor is coupled to the node between the first inductor and the fourth resistor.

The transistor-based filter can further include a third transistor. A base of the third transistor is coupled to the collector of the first transistor; a fifth resistor is inserted between the collector of the first transistor and the load; a collector of the third transistor is coupled to the emitter of the first transistor; an emitter of the third transistor is coupled to the node between the fifth resistor and the load.

In another embodiment a fifth capacitor is coupled between the base and collector of the first transistor.

In another embodiment of the present invention, a transistor-based filter for inhibiting load noise from entering a power supply is disclosed. The filter includes a first transistor with an emitter coupled to a power supply, a collector coupled to a load, and a base. The filter also includes a first capacitor coupled between the base and a ground terminal. The first capacitor charges through the base of the first transistor, turning the first transistor on. The filter further includes a first inductor coupled between the base and a node between the collector and the load, wherein the first inductor pulls a bias current from the base of the first transistor to keep it turned on after the first capacitor has charged.

In one embodiment, the transistor-based filter further comprises at least one diode coupled between the base and the collector of the transistor.

In one embodiment, the transistor-based filter further comprises a first resistor inserted between the first inductor and the node between the collector and the load; and a second capacitor coupled from the node between the first inductor and the first resistor to the ground terminal.

In another embodiment, the transistor-based filter also comprises a second inductor coupled between the power supply and the emitter.

In another embodiment, the transistor-based filter also comprises a third capacitor coupled between the node common to the collector and the load, and the ground terminal.

In another embodiment, the transistor-based filter also comprises a fourth capacitor coupled between a node common to the power supply and the second transistor, and the ground terminal.

In another embodiment, the transistor-based filter also comprises a second resistor inserted between the base of the first transistor and the first capacitor.

In another embodiment, the transistor-based filter comprises a snubber network to reduce oscillations, if any, occurring at the node common to the second inductor and the first transistor. In one embodiment, the snubber network is coupled from the node between the second inductor and the first transistor to the ground terminal. In another embodiment, the snubber network is coupled from the node between the second inductor and the first transistor to the base of the first transistor. In another embodiment, the snubber network is coupled from the node between the second inductor and the first transistor to the power supply.

In one embodiment, the transistor-based filter includes a second transistor. A base of the second transistor is coupled to the emitter of the first transistor; a third resistor is inserted between the emitter of the first transistor and the second inductor; a collector of the second transistor is coupled to the collector of the first transistor; an emitter of the second transistor is coupled to the node between the second inductor and the third resistor.

The transistor-based filter can further include a third transistor. A base of the third transistor is coupled to the collector of the first transistor; a fourth resistor is inserted between the collector of the first transistor and the load; a collector of the third transistor is coupled to the emitter of the first transistor; an emitter of the third transistor is coupled to the node between the fourth resistor and the load.

In another embodiment of the present invention, a transistor-based filter for inhibiting load noise from entering a power supply is disclosed. The filter includes a first transistor with an emitter coupled to a power supply, a collector coupled to a load, and a base. The filter also includes a first capacitor coupled between the base of the first transistor and a ground terminal. The first capacitor charges through the base of the first transistor, turning the first transistor on. The filter further includes a second transistor with an emitter coupled to the node between the base of the first transistor and the first capacitor. The filter also includes a first resistor coupled between a collector of the second transistor and the load. The filter also includes a second capacitor coupled between a base of the second transistor and the ground terminal. The filter also includes a second resistor coupled between the base and collector of the second transistor, to keep the second transistor biased on during normal operation.

In one embodiment, a third resistor is connected between the emitter and the base of the first transistor.

In another embodiment, a fourth resistor is inserted between the base of the first transistor and the node between the first capacitor and the emitter of the second transistor.

In another embodiment, a diode network is connected between the node common to the first inductor and the emitter of the first transistor, and both the first and second capacitors, wherein the diode network charges the first and second capacitors rapidly upon startup, and limits the voltage developed across the fourth resistor, thus limiting the current passing through the base-emitter junctions of both the first and second transistors.

In another embodiment, the transistor-based filter further comprises at least one diode coupled between the base and the collector of the second transistor, wherein an anode of the at least one diode is coupled to the base, and a cathode of the at least one diode is coupled to the collector.

In another embodiment, the transistor-based filter also comprises a third capacitor coupled between the node common to the collector of the first transistor and the load, and the ground terminal.

In another embodiment, the transistor-based filter also comprises a first inductor coupled between the power supply and the emitter of the first transistor.

In another embodiment, the transistor-based filter also comprises a fourth capacitor coupled between a node common to the power supply and the first inductor, and the ground terminal.

In another embodiment, the transistor-based filter comprises a snubber network to reduce oscillations, if any, occurring at the node common to the first inductor and the first transistor. In one embodiment, the snubber network is coupled from the node between the first inductor and the first transistor to the ground terminal. In another embodiment, the snubber network is coupled from the node between the first inductor and the emitter of the first transistor to the base of the first transistor. In another embodiment, the snubber network is coupled from the node between the first inductor and the first transistor to the power supply.

In one embodiment, the transistor-based filter comprises a third transistor. A base of the third transistor is coupled to the emitter of the first transistor; a fifth resistor is inserted between the emitter of the first transistor and the first inductor; a collector of the third transistor is coupled to the collector of the first transistor; an emitter of the third transistor is coupled to the node between the first inductor and the fifth resistor.

In another embodiment, the transistor-based filter also comprises a fourth transistor, wherein a base of the fourth transistor is coupled to a node common to the load and the collector of the first transistor; a sixth resistor is inserted between the collector of the first transistor and the load; a collector of the fourth transistor is coupled to the emitter of the first transistor; an emitter of the fourth transistor is coupled to the node between the sixth resistor and the load.

In another embodiment a fifth capacitor is coupled between the base and collector of the first transistor.

BRIEF DESCRIPTION OF THE DRAWINGS

FIGS. 1A and 1B illustrate basic RC and LC passive filters.

FIG. 2 illustrates a basic active filter.

FIG. 3 illustrates a basic transistor-based filter known as a capacitance multiplier.

FIG. 4 illustrates a transistor-based filter for inhibiting load noise from entering a power supply, in accordance with one embodiment of the present invention.

DETAILED DESCRIPTION OF THE PREFERRED EMBODIMENTS

Figure 5:
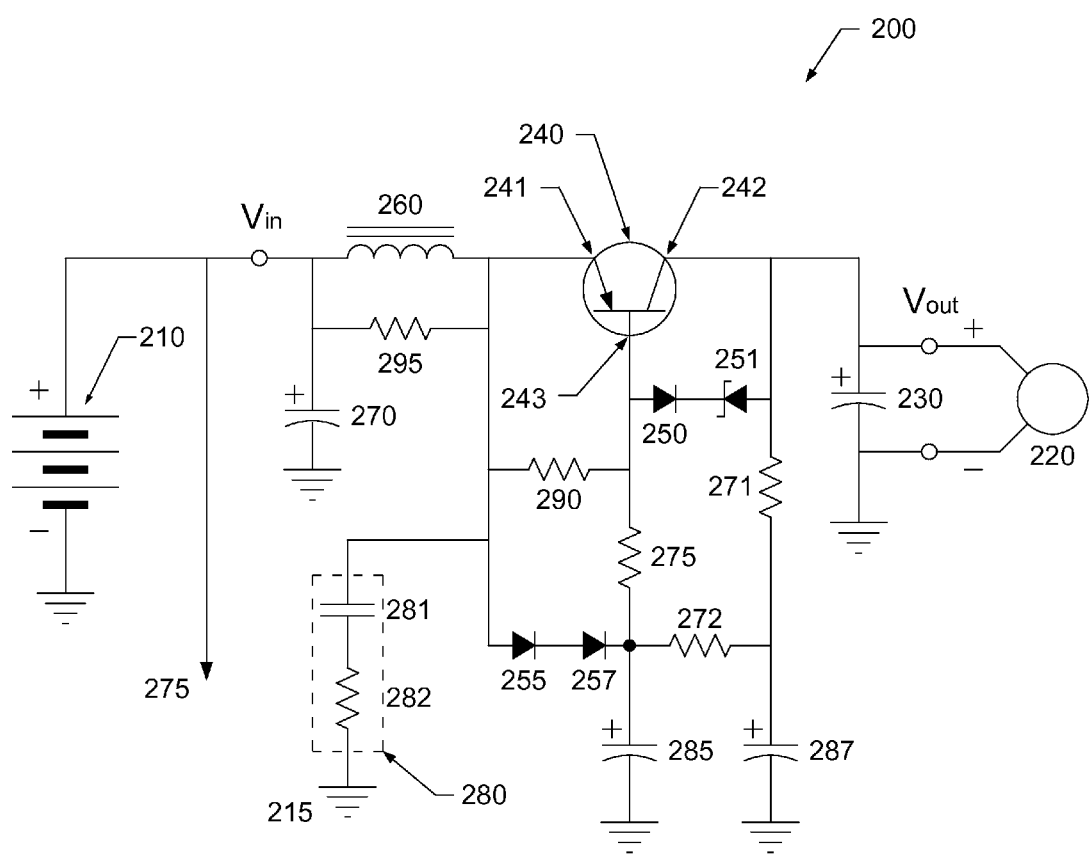
FIG. 5 illustrates a transistor-based filter for inhibiting load noise from entering a power supply, in accordance with another embodiment of the present invention.

The present invention is directed to a transistor-based filter that allows high currents to a load if necessary and filters noise from that load from getting back into the power supply. Existing transistor filters operate by preventing power supply noise from entering the load, rather than protecting a power distribution system from noisy loads such as brushless DC fan motors. In the present invention, the filtering action is opposite to the power flow.

FIG. 4 illustrates a transistor-based filter 100 for inhibiting load noise from entering a power supply, in accordance with one embodiment of the present invention. The filter 100 comprises a transistor 130 with an emitter 131 arranged to receive a positive connection of an input voltage $V_{in}$, a collector 132 arranged to provide an output voltage $V_{out}$ to a load, and a base 133 coupled to a junction of a capacitor 150 connected to ground 160 and a resistor 140 coupled to a node between the collector 132 and $V_{out}$.

Compared to the circuit of FIG. 3, the circuit of FIG. 4 uses the opposite polarity of the transistor, and the location of the resistor has changed. Electric current and power still flow through the circuit of FIG. 4 from left to right, but the high and low impedance terminals of the transistor have been swapped. Hence, in FIG. 4, the input voltage $V_{in}$ is relatively unaffected by the output voltage $V_{out}$ because of the high impedance of the collector of the transistor. In essence, the direction of the filtering action has been reversed. The power supply is protected from noise developed in the load.

Also, unlike the circuit of FIG. 3, a current surge through the transistor to the power supply cannot occur in the circuit of FIG. 4. This is because in FIG. 4, the load sees the high impedance collector of the transistor, which acts as a current source and naturally regulates current flow. Any attempt of the load to pull a current surge from the filter results in a drop in $V_{out}$. Rather than producing a large surge current through the circuit, it causes a linear increase in base current through the transistor because of the increased voltage drop across resistor 140, which in turn results in a linear increase in load current through the amplifying action of the transistor, and thus a linear increase in current demand from the power supply. Assuming low impedance of the power supply driving the filter, such a linear increase in current would cause a negligible change in power rail voltage. (Conversely, a relatively small change in input voltage applied to the filter can suddenly increase $V_{out}$ or drop it momentarily to zero. In other words this particular filter configuration does not shield the load from power supply fluctuations.)

FIG. 5 illustrates a transistor-based filter 200 for inhibiting load noise from entering a power supply, in accordance with another embodiment of the present invention. The RC filter is replaced with a two-stage filter, significantly improving the noise rejection of the circuit. An output capacitor 230 is added immediately before the load 220, providing a low impedance pathway for rapid signals to the load. It acts as a storage mechanism for the surge current, which a noisy load such as a brushless DC fan motor may demand. More importantly, the circulation of this current can be kept localized to the output capacitor 230 and the load 220, keeping the surge current from passing through the ground plane. A diode 250 and zener diode 251 are added, which prevent the collector 242 of the transistor 240 from falling more than a predetermined amount below the base 243 by pulling more base current, thus turning on the transistor 240 harder. The values of filter resistors 271 and 272 need to be calculated in order to provide sufficient base current, given this predetermined maximum voltage drop, corresponding to a given load current and a given transistor. Otherwise diodes 250 and 251 will conduct all the time and the filter 200 will be ineffective. Any series combination of rectifier diodes, zener diodes and Schottky diodes can be used.

The inductor 260 added between the power supply 210 and the emitter 241 of the transistor 240 enhances the action of the filter 200. Since the transistor 240 in this configuration is very sensitive to voltage change at its emitter 241, any counter electromotive force (EMF) generated by the inductor 260 in response to a changing current through its windings, produces a larger impact on that current flow than would result from the action of inductor 260 alone. However, since this configuration can tend to cause oscillations due to time delays between the counter EMF generated by the inductor 260 and the action of the transistor 240, snubber components may be required. These can include the resistor 295 across the inductor 260, the resistor 290 from the emitter 241 to the base 243, and the resistor-capacitor combination 282 and 281 from the node between the inductor 260 and the emitter 241, to ground 215. The filter 200 of FIG. 5 also includes filter resistors (or filter impedances) 271 and 272, filter capacitors 285 and 287, and a line 275 designating other components coupled to the circuit.

The resistor 275 inserted between the base 243 of the transistor 240 and the capacitor 285, works in concert with the diodes 255 and 257 connected between the emitter 241 of the transistor 240, and the node between the resistor 275 and the capacitor 285, to limit the current through the base-emitter junction of the transistor 240 upon initial application of the power to the filter circuit 200.

Figure 6:
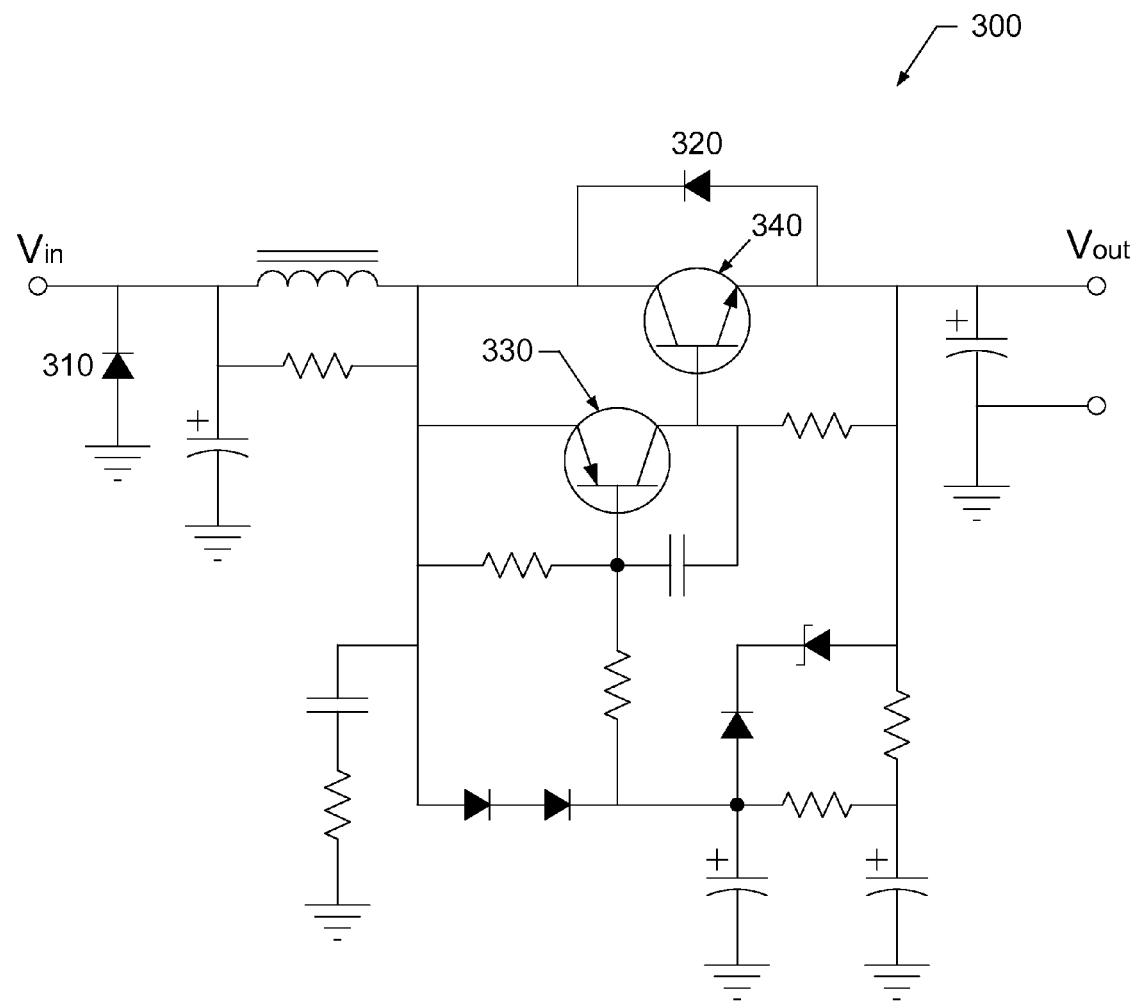
FIG. 6 illustrates a transistor-based filter for inhibiting load noise from entering a power supply, in accordance with another embodiment of the present invention.

In another embodiment of the present invention, as illustrated in FIG. 6, a transistor-based filter 300 for inhibiting load noise from entering a power supply is disclosed. Filter 300 is similar to Filter 200, except that it comprises a complementary Darlington transistor pair, 330 and 340. Filter 300 further includes reverse polarity input protection diode 310 and transistor protection diode 320.

The input protection diode 310 protects the filter 300 (and connected load) from a reverse voltage connection to the input, $V_{in}$. The complementary Darlington transistor pair 330 and 340, provide larger output currents than a single transistor configuration. The transistor protection diode 320 prevents damage to the transistor pair 330 and 340 due to reverse current flow in the event of the shorting of input $V_{in}$.

Figure 7:
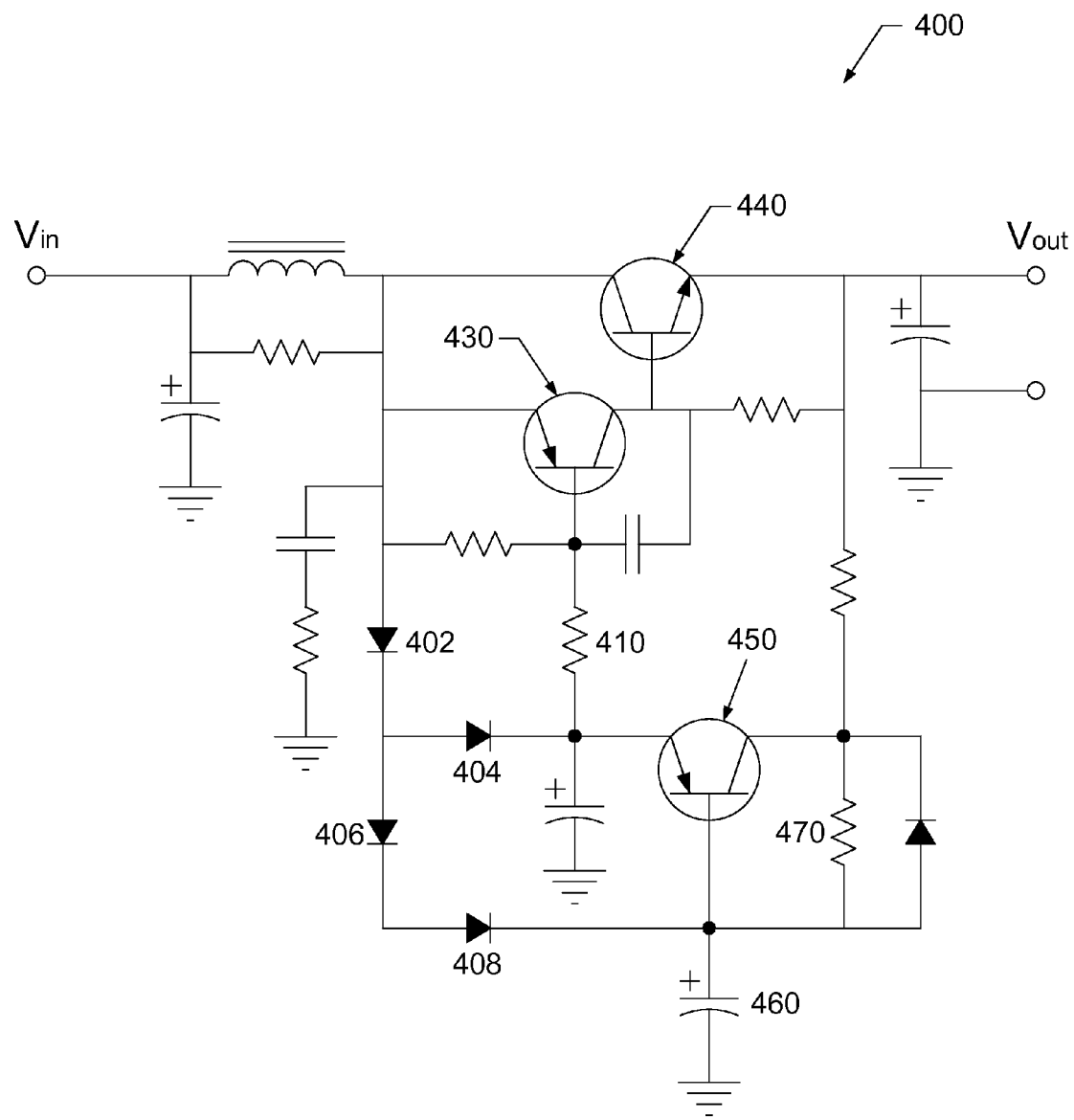
FIG. 7 illustrates a transistor-based filter for inhibiting load noise from entering a power supply, in accordance with another embodiment of the present invention.

In another embodiment of the present invention, as illustrated in FIG. 7, a transistor-based filter 400 for inhibiting load noise from entering a power supply is disclosed. Filter 400 is similar to Filter 300, except that it comprises two transistor-based filters, one nested within the other. Complementary Darlington transistor pair 430 and 440 and surrounding components constitute a transistor-based filter similar to Filter 300. Transistor 450, capacitor 460 and resistor 470 constitute a second transistor-based filter inserted in the current pathway for the bias of Darlington pair 430 and 440 of the first transistor filter. In this manner, the bias current supplied to Darlington pair 430 and 440 is filtered by the second transistor filter comprising transistor 450, capacitor 460 and resistor 470. The diode network 402, 404, 406 and 408 and the resistor 410 protect the base-emitter junctions of transistors 430 and 450 upon application of power to the filter at $V_{in}$.

In another embodiment, the diode network 402, 404, 406 and 408, can be replaced with other components that have a similar functionality to diodes, or protect transistors 430 and 450 in a similar manner.

Experimental Section

The following examples serve to illustrate certain exemplary embodiments and aspects of the present invention and are not to be construed as limiting the scope thereof.

Experimental Set-up and Results

Comparative measurements were taken using several different embodiments of reverse transistor filter (herein also referred to as RQF), with similar time constants and voltage drops. A commercial 24-V brushless DC fan was used as the load, drawing approximately 70 mA average current from the power supply. A 24-V DC battery bank was used as the power supply, which provided an electrically quiet background for the measurements being performed. Measurements of the noise at the power supply and the fans were taken, both versus time, and in spectral density format versus frequency, in order to compare the performance of various filter configurations.

One embodiment tested was similar to embodiment 200 shown in FIG. 5, wherein transistor 240 was a 2N2907A. The following components were absent: resistors 282, 295, leaving their connections open; resistor 272, leaving its connections shorted; capacitors 281 and 287, leaving their connections open; diodes 250 and 251, leaving their connections open. Capacitors 230, 285 and 270 were 100 μF; resistor 271 was 10 kΩ; resistor 290 was 56 kΩ; resistor 275 was 100Ω; inductor 260 was 470 μH; diodes 255 and 257 were 1N4006. This embodiment is referred to in the spectral density plot shown in FIG. 10 as RQF; the inductor 260 could be shorted out or left intact, these two variations being referenced by RQF NO INDUCTOR and RQF WITH INDUCTOR in the time dependent plots shown in FIGS. 8 and 9.

Another embodiment tested was similar to embodiment 400 shown in FIG. 7, wherein transistors 430 and 450 were 2N3906, and transistor 440 was a 2N2222A. Resistor 470 was 1 MΩ; capacitor 460 was 10 μF. The remaining components were similar to those described above for RQF. This embodiment is referred to in both spectral density and time dependent plots as NESTED RQF.

Another circuit tested was similar to that shown in FIG. 1A, where the resistor was 27 Ω, and the capacitor was 200 μF. This embodiment was referred to as RC FILTER.

A remaining test performed was a measurement of the power supply voltage characteristics with the fan connected to the power supply directly, wherein no filter was inserted between the fan and the power supply, this arrangement being referred to as FAN, NO FILTER.

A remaining test performed was a measurement of the power supply voltage characteristics without the fan connected to the power supply, wherein nothing was connected to the power supply except the measurement device. This arrangement is referred to as NO LOAD.

Figure 8:
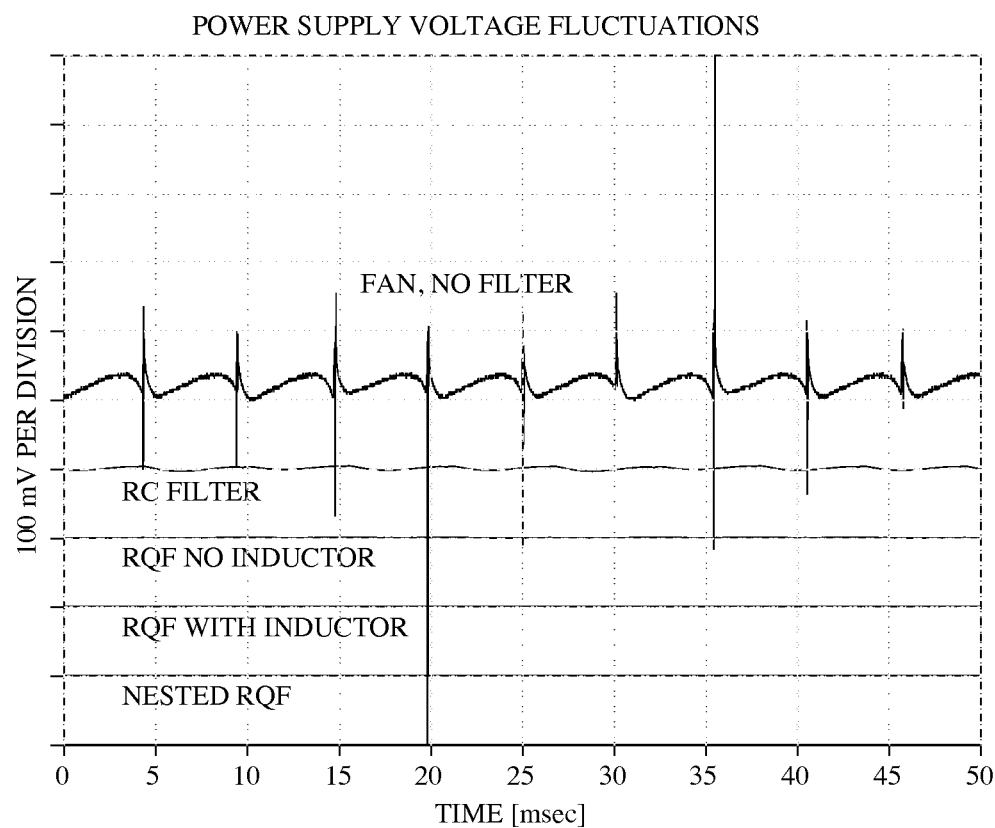
FIG. 8 shows power supply voltage fluctuations versus time, induced by a brushless DC cooling fan, for circuits using certain embodiments of the present invention.

FIG. 8 shows the power supply voltage versus time for the cases of FAN, NO FILTER; RC FILTER; RQF NO INDUCTOR; RQF WITH INDUCTOR; NESTED RQF. In this figure, significant noise is visible for FAN, NO FILTER. Not only is approximately 35 mV peak-to-peak (mVpp) continuous ripple observed, but large voltage spikes of up to 500 mV peak (mVp) are observed. Some small ripple is visible for RC FILTER. For the remaining traces, no significant ripple is obvious in FIG. 8.

Figure 9:
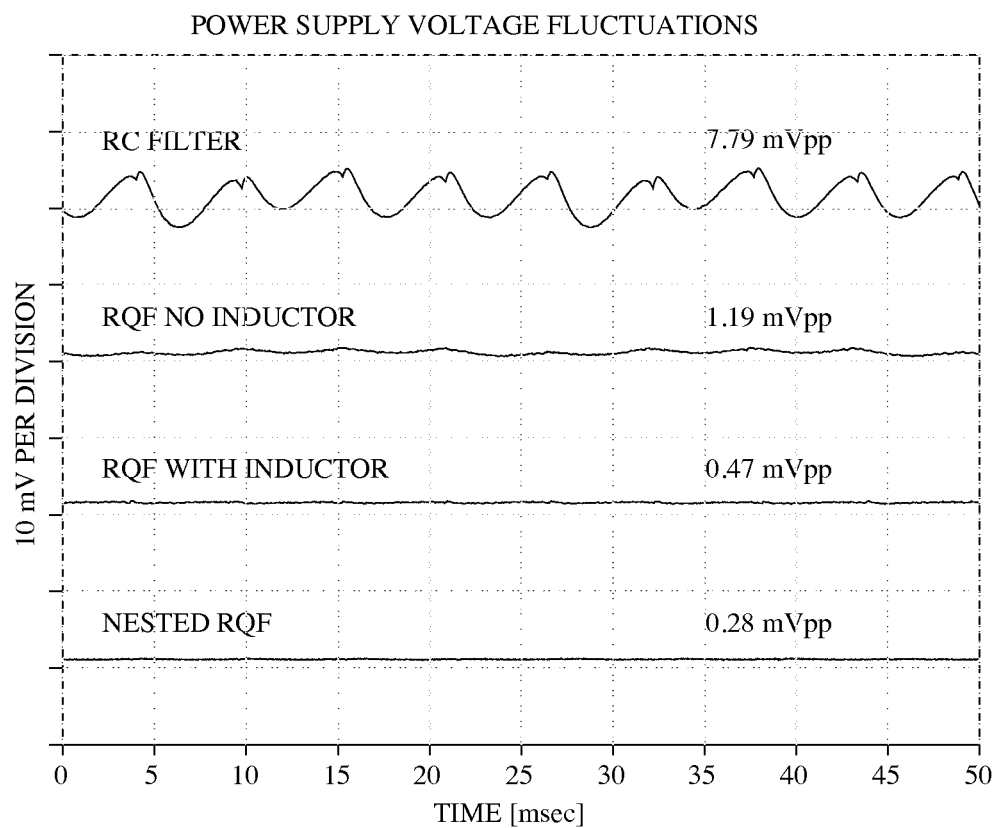
FIG. 9 shows power supply voltage fluctuations versus time, induced by a brushless DC cooling fan, for circuits using certain embodiments of the present invention.

FIG. 9 shows the same traces of FIG. 8, excluding the first trace: FAN, NO FILTER. The scale is magnified by a factor of ten, rendering the remaining ripple on the traces more visible and more easily comparable. On this figure the RC FILTER ripple is 7.79 mVpp over the data taken for this figure; RQF NO INDUCTOR shows a significant decrease from this value, being 1.19 mVpp; RQF WITH INDUCTOR shows a decrease in turn, being 0.47 mVpp; NESTED RQF shows the lowest voltage fluctuations at the power supply of 0.28 mVpp.

Figure 10:
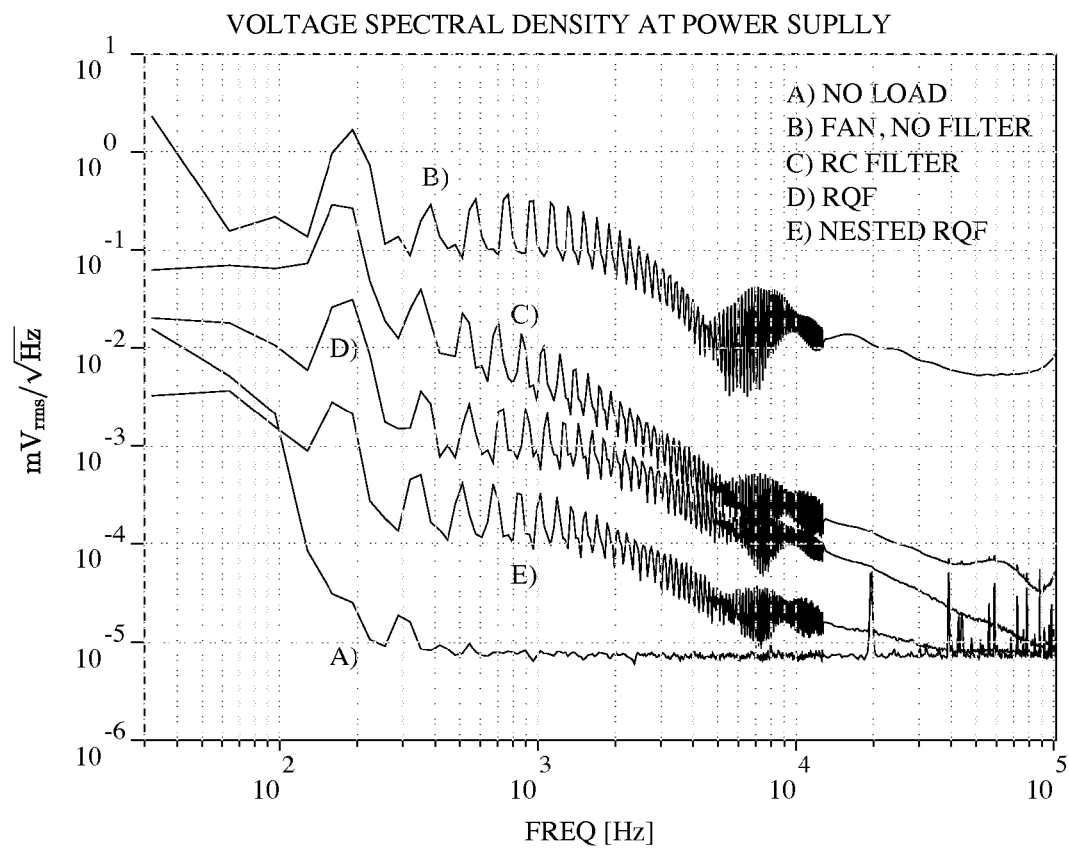
FIG. 10 shows power supply voltage spectral density, resulting from a brushless DC cooling fan, for circuits using certain embodiments of the present invention.

FIG. 10 shows the voltage spectral density at the power supply for various arrangements and filter embodiments. These measurements indicate the voltage noise present in each 1-Hz frequency bin from approximately 30 Hz out to 100 kHz, the unit on the vertical scale of mVrms/sqrt(Hz) being typical of this type of measurement. Trace A) is NO LOAD, and is essentially the noise floor of the measurement series, recorded with the power supply connected to the measurement instrument, in the absence of load or filter. Trace B) is FAN, NO FILTER, showing considerable noise content across the whole given frequency range. Each subsequent trace shows progressive noise reduction; the order of decreasing voltage spectral density being C) RC FILTER, D) RQF (this embodiment includes inductor 260), and finally E) NESTED RQF. The results from this final embodiment approach the measurement floor from approximately 40 kHz out to 100 kHz.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made in the embodiments chosen for illustration without departing from the spirit and scope of the invention.

We claim:

1. A transistor based filter for inhibiting load noise from entering a power supply, comprising:
   a. a first transistor with an emitter directly coupled to a power supply, a collector coupled to a load, and a base;
   b. a first capacitor coupled between the base and a ground terminal; and
   c. a first impedance coupled between the base and a node between the collector and the load.

2. The transistor-based filter of claim 1 wherein the first impedance is a resistor.

3. The transistor-based filter of claim 1 wherein the first impedance is an inductor.

4. The transistor-based filter of claim 1 wherein the first impedance is a combination of a resistor and an inductor.

5. The transistor-based filter of claim 1 further comprising at least one diode coupled between the base and the collector of the first transistor, wherein an anode of the at least one diode is coupled to the base and a cathode of the at least one diode is coupled to the collector, wherein the diodes are coupled in series.

6. The transistor-based filter of claim 1 further comprising at least one zener diode coupled between the base and the collector of the first transistor, wherein a cathode of the at least one zener diode is coupled to the base and an anode of the at least one zener diode is coupled to the collector, wherein the zener diodes are coupled in series.

7. The transistor-based filter of claim 1 further comprising diodes and zener diodes between the base and the collector of the first transistor, wherein the diodes and zener diodes are coupled in series.

8. The transistor-based filter of claim 1 further comprising a first resistor inserted between the first impedance and the node between the first impedance and first resistor to the ground terminal.

9. The transistor-based filter of claim 1 wherein the load is a fan or a pump.

* * * * *